(12) United States Patent
Singh et al.

(10) Patent No.: US 10,882,737 B2
(45) Date of Patent: Jan. 5, 2021

(54) THROUGH SILICON INTERPOSER WAFER AND METHOD OF MANUFACTURING THE SAME

(71) Applicant: AGENCY FOR SCIENCE, TECHNOLOGY AND RESEARCH, Singapore (SG)

(72) Inventors: Navab Singh, Singapore (SG); Daw Don Cheam, Singapore (SG)

(73) Assignee: Agency for Science, Technology and Research, Singapore (SG)

(*) Notice: Subject to any disclaimer, the term of this patent is extended or adjusted under 35 U.S.C. 154(b) by 0 days.

(21) Appl. No.: 16/088,021

(22) PCT Filed: Mar. 23, 2017

(86) PCT No.: PCT/SG2017/050145
§ 371 (c)(1),
(2) Date: Sep. 24, 2018

(87) PCT Pub. No.: WO2017/164816
PCT Pub. Date: Sep. 28, 2017

(65) Prior Publication Data
US 2019/0084826 A1 Mar. 21, 2019

(30) Foreign Application Priority Data
Mar. 24, 2016 (SG) .......................... 10201602341R (51) Int. Cl.
*H01L 21/48* (2006.01)
*B81B 7/00* (2006.01)
(Continued)

(52) U.S. Cl.
CPC .......... *B81B 7/007* (2013.01); *B81C 1/00301* (2013.01); *B81C 1/00587* (2013.01);
(Continued)

(58) Field of Classification Search
CPC ............. H01L 21/486; H01L 23/49827; H01L 23/5226; H01L 2225/06548
See application file for complete search history.

(56) References Cited

U.S. PATENT DOCUMENTS

| 2006/0001173 A1 | 1/2006 | Yamano et al. |
| 2013/0193527 A1 | 8/2013 | Chu et al. |

(Continued)

FOREIGN PATENT DOCUMENTS

| CN | 102412228 A | 4/2012 |
| CN | 105174195 A | 12/2015 |

OTHER PUBLICATIONS

PCT International Search Report for PCT Counterpart Application No. PCT/SG2017/050145, 4 pgs. (dated Jun. 18, 2017).
(Continued)

*Primary Examiner* — Jeremy C Norris
(74) *Attorney, Agent, or Firm* — Womble Bond Dickinson (US) LLP (57) ABSTRACT

A through silicon interposer wafer and method of manufacturing the same. A through silicon interposer wafer having at least one cavity formed therein for MEMS applications and a method of manufacturing the same are provided. The through silicon interposer wafer includes one or more filled silicon vias formed sufficiently proximate to the at least one cavity to provide support for walls of the at least one cavity during subsequent processing of the interposer wafer.

25 Claims, 6 Drawing Sheets

(51) Int. Cl.
*B81C 1/00* (2006.01)
*H01L 23/48* (2006.01)
*H01L 23/14* (2006.01)
*H01L 23/13* (2006.01)
*H01L 23/498* (2006.01)

(52) U.S. Cl.
CPC ........ *H01L 23/48* (2013.01); *B81B 2203/033* (2013.01); *B81B 2203/0315* (2013.01); *B81B 2207/095* (2013.01); *B81C 2201/014* (2013.01); *B81C 2201/0132* (2013.01); *B81C 2203/0118* (2013.01); *H01L 21/486* (2013.01); *H01L 23/13* (2013.01); *H01L 23/147* (2013.01); *H01L 23/49827* (2013.01)

(56) References Cited

U.S. PATENT DOCUMENTS

| | | |
|---|---|---|
| 2014/0191341 A1 | 7/2014 | Chu et al. |
| 2015/0115376 A1 | 4/2015 | Chen et al. |
| 2016/0039663 A1 | 2/2016 | Lin |
| 2018/0290882 A1* | 10/2018 | Rhee .................. B81C 1/00269 |

OTHER PUBLICATIONS

PCT Written Opinion of the International Searching Authority for PCT Counterpart Application No. PCT/SG2017/050145, pgs. 5 pgs. (dated Jun. 18, 2017).

PCT International Preliminary Report on Patentability for PCT Counterpart Application No. PCT/SG2017/050145, 16 pgs. (dated Feb. 27, 2018).

\* cited by examiner

THROUGH SILICON INTERPOSER WAFER AND METHOD OF MANUFACTURING THE SAME

PRIORITY CLAIM CROSS-REFERENCE TO RELATED APPLICATIONS

This patent application is a U.S. National Phase Application under 35 U.S.C. § 371 of International Application No. PCT/SG2017/050145, filed on 23 Mar. 2017, entitled A THROUGH SILICON INTERPOSER WAFER AND METHOD OF MANUFACTURING THE SAME, which claims the benefit of priority from Singapore Patent Application No. 10201602341R, filed on 24 Mar. 2016, the content of which was incorporated herein by reference in its entirety for all purposes.

TECHNICAL FIELD

The present invention generally relates to a through silicon interposer (TSI) wafer. In particular, it relates to a TSI wafer for encapsulation of micro-electro-mechanical system (MEMS) device.

BACKGROUND ART

Wafer level packaging (WLP) is one of the critical steps in the commercialization of micro-electronic-mechanical systems (MEMS) devices. Generally, WLP comprises bonding a cap wafer on top of a MEMS wafer. The cap wafer protects the fragile MEMS devices from the ambient environment and provides the required vacuum or controlled environment for the MEMS devices to operate in. The cap wafer may also host vertical electrodes for the 3D MEMS devices such as 3-axes accelerometers. Commonly used WLP techniques include CMOS-MEMS wafer bonding, dummy cap-MEMS wafer bonding and through silicon interposer (TSI)-MEMS bonding.

CMOS-MEMS wafer bonding and dummy cap-MEMS wafer bonding are commonly used low cost WLP techniques. However, the flexibility of the two WLP techniques is limited. CMOS-MEMS bonding is constrained by face-to-face (F2F) bonding requirements and generally incur significant unused area due to mismatch in size of MEMS and ASIC. Dummy cap-MEMS wafer bonding similarly faces limited functionality. Wire bonding is required between the (application specific integrated circuit) ASIC and MEMS, which affects performance of the resulting product. While TSI-MEMS wafer bonding is a flexible process with no device/wafer size matching requirements or material restrictions, the method is costly as the process used to fabricate the cap wafer is complicated and may involve up to seven masking steps. Further, degassing from the dielectrics deposited through plasma enhanced chemical vapour deposition (PEVCD) may occur. Degassing degrades the enclosed environment in which the MEMS devices operate. Nonetheless, if the drawbacks of TSI-MEMS wafer bonding are mitigated, the process potentially offers an advantageous solution for WLP of MEMS devices.

Accordingly, what is needed is TSI wafer and method of manufacturing the same that seeks to address some of the above problems. Furthermore, other desirable features and characteristics will become apparent from the subsequent detailed description and the appended claims, taken in conjunction with the accompanying drawings and this background of the disclosure.

SUMMARY OF INVENTION

A first aspect of the present invention provides a through silicon interposer wafer having at least one cavity formed therein for MEMS applications, the interposer wafer comprising one or more filled silicon vias formed sufficiently proximate to the at least one cavity to provide support for walls of the at least one cavity during subsequent processing of the interposer wafer.

The one or more filled silicon vias may include one or more filled through silicon vias. The one or more filled through silicon vias may be filled with material for providing electrical feedthrough from one side to other of the interposer wafer.

The one or more filled silicon vias may be filled with material comprising a first conductive material and a second conductive material, the first and second conductive materials separated by a first dielectric material.

At least a portion of the first and the second conductive materials may be electrically connected through a third conductive material, the third conductive material disposed on at least a portion of the second conductive material.

The interposer wafer may include a second dielectric material disposed on a surface of the interposer wafer, the second dielectric further disposed within the one or more filled silicon vias and between material that fills the filled silicon vias and the interposer wafer.

The interposer wafer may further include at least one standoff, wherein the at least one standoff includes the first and second conductive materials separated by the first dielectric material and electrically connected through the third conductive material.

Each of the at least one standoff may define a local bonding area for one or more bond pads and/or one or more sealing rings.

The interposer wafer may further include at least one electrode, wherein the at least one electrode includes the first conductive material and the third conductive material.

The interposer wafer may further include at least one redistribution line, wherein the at least one redistribution line includes the first conductive material and/or the third conductive material.

The first and the second conductive material may include either polysilicon or copper.

The third conductive material may include a material selected from a group comprising tantalum, tantalum alloys, tantalum nitrides, titanium, titanium alloys, titanium nitrides and germanium or a combination of these materials.

The interposer wafer may further include a getter material formed over an open surface of the at least one cavity.

A second aspect of the present invention provides a method of manufacturing a through silicon interposer wafer having at least one cavity formed therein for MEMS applications. The method includes forming one or more filled silicon vias in the interposer wafer, and thereafter forming the at least one cavity within the interposer wafer sufficiently proximate to at least one of the one or more silicon vias such that the at least one of the one or more silicon vias provide support for walls of the at least one cavity during formation and subsequent processing of the interposer wafer.

The step of forming one or more filled silicon vias in the interposer wafer may include forming one or more silicon vias in the interposer wafer, and filling the one or more silicon vias with material to provide the support for the walls of the at least one cavity during the formation and subsequent processing of the interposer wafer.

The step of forming one or more filled silicon vias in the interposer wafer may include forming one or more through silicon vias in the interposer wafer.

The step of filling the one or more silicon vias may include filling the one or more silicon vias with material which will provide electrical feedthrough from one side to other of the interposer wafer.

The step of filling the one or more silicon vias with the material may include depositing a first conductive material on the interposer and within the one or more silicon vias, forming a first dielectric material on the first conductive material, and depositing a second conductive material on the first dielectric material.

The method may further include depositing a third conductive material on at least a portion of the second conductive material, wherein the third conductive material electrically connects at least a portion of the first and the second conductive material.

The step of filling the one or more silicon vias with the material may include forming a second dielectric material on a surface of the interposer wafer, the at least one cavity having an opening in the surface of the interposer wafer, the second dielectric further formed within the one or more silicon vias and between the first conductive material and the interposer wafer.

The method may further include patterning the second conductive material and then depositing the third conductive material to form at least one standoff, the standoff comprising the first and second conductive layers separated by the first dielectric layer, and electrically connected through the third conductive layer.

The method may further include simultaneously patterning the first conductive material and the third conductive material to form at least one electrode, the electrode comprising the first conductive material and the third conductive material.

The method may further include patterning the third conductive material and the first conductive material at the at least one additional element after depositing the third conductive material to form at least one electrode, the electrode comprising the first conductive material and the third conductive material.

The step of patterning the third conductive material and the first conductive material to form the at least one electrode may include patterning the third conductive material and the first conductive material to form the at least one electrode and at least one redistribution line, the at least one redistribution line comprising the first conductive material and/or the third conductive material.

The first and the second conductive material may include either polysilicon or copper.

The third conductive material may include a material selected from a group comprising tantalum, tantalum alloys, tantalum nitrides, titanium, titanium alloys, titanium nitrides and germanium or a combination of these materials.

The step of forming an open surface of the at least one cavity may include depositing a getter over a surface of the at least one cavity.

The step of patterning the second conductive material to form the at least one standoff and the at least one additional element may further include adjusting a height and/or a surface roughness of the second conductive material.

BRIEF DESCRIPTION OF DRAWINGS

Embodiments of the invention will be better understood and readily apparent to one of ordinary skill in the art from the following written description, by way of example only, and in conjunction with the drawings, in which:

FIG. 1

FIG. 2

FIG. 3

FIG. 4

FIG. 5

FIG. 6

Skilled artisans will appreciate that elements in the figures are illustrated for simplicity and clarity and have not necessarily been depicted to scale. For example, the dimensions of some of the elements in the illustrations, block diagrams or flowcharts may be exaggerated in respect to other elements to help to improve understanding of the present embodiments.

DESCRIPTION OF EMBODIMENTS

The following detailed description is merely exemplary in nature and is not intended to limit the invention or the application and uses of the invention. Furthermore, there is no intention to be bound by any theory presented in the preceding background of the invention or the following detailed description.

Herein, a through silicon interposer (TSI) wafer and method of manufacturing the TSI wafer are presented in accordance with present embodiments having the advantages of reduced masking layers, lower fabrication cost and high manufacturability. Particularly, the reduced masking layers can lower the number of processing steps (e.g. patterning) required to fabricate the TSI wafer, and hence reduce process complexity and fabrication cost. For example, in embodiments of the present invention, up to three masking steps can be eliminated compared to conventional approaches, through (i) elimination of the mask required for redistribution line connection to through silicon vias, (ii) elimination of the mask required for removal of bonding material (e.g. germanium) from the electrode and/or redistribution lines, as the removal of the bonding material is not required due to the conductive material underneath the bonding material being a non-eutectic pair and (iii) elimination of the mask required for getter film lift-off by using the same photomask used in the etching of cavity on the interposer wafer.

Embodiments of the present invention are also implementable with complementary metal-oxide-semiconductor (CMOS) compatible materials such as polysilicon, titanium and germanium, and thus can be seamlessly integrated with CMOS in any foundry. Moreover, embodiments can advantageously avoid deposition of dielectrics through plasma-enhanced chemical vapor deposition (PECVD), which is known to outgas and degrade vacuum, and low-outgassing materials can be used to maintain vacuum levels required for proper function of the devices encapsulated with the TSI wafer. The TSI wafer can also make MEMS wafer level packaging independent of ASIC die and/or wafer size matching requirements. Thus, the TSI wafer demonstrates versatility and can be used to package different microelectronic-mechanical systems (MEMS) devices.

The through silicon interposer (TSI) wafer in accordance with embodiments of the present invention includes at least one cavity formed therein for MEMS applications. The interposer wafer also includes one or more filled silicon vias formed sufficiently proximate to the at least one cavity to provide support for walls of the at least one cavity during subsequent processing of the interposer wafer. Particularly, in embodiments, the one or more filled silicon vias can define the walls of the at least one cavity. The one or more filled silicon vias can outline the at least one cavity, and advantageously facilitate patterning process (e.g. lift-off technique) of getter films. For example, the one or more filled silicon vias can beneficially ensure a clean and complete lift-off of the getter film, and thus avoid defects and further processing steps (and costs) associated with incomplete lift-off. Getter films typically comprise a thin-film deposit of getter materials, the getter material being a reactive material that is placed inside a vacuum system for the purpose of achieving and maintaining a vacuum.

Figure 1A:
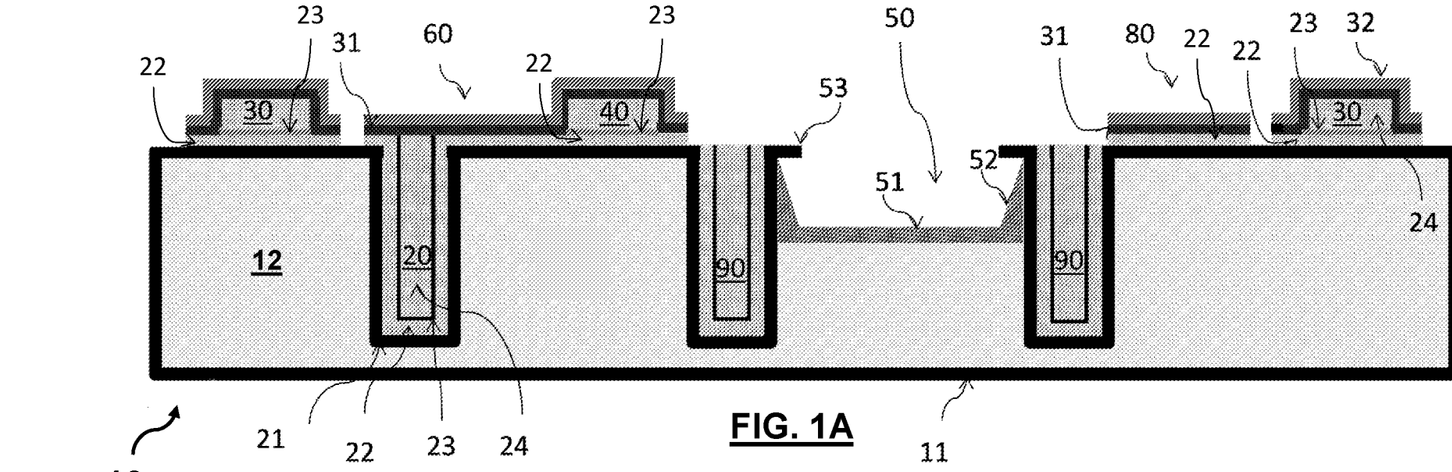
FIGS. 1A and 1B show cross-sectional and plan views of a through silicon interposer wafer in accordance with a first embodiment of the present invention.
Figure 1B:
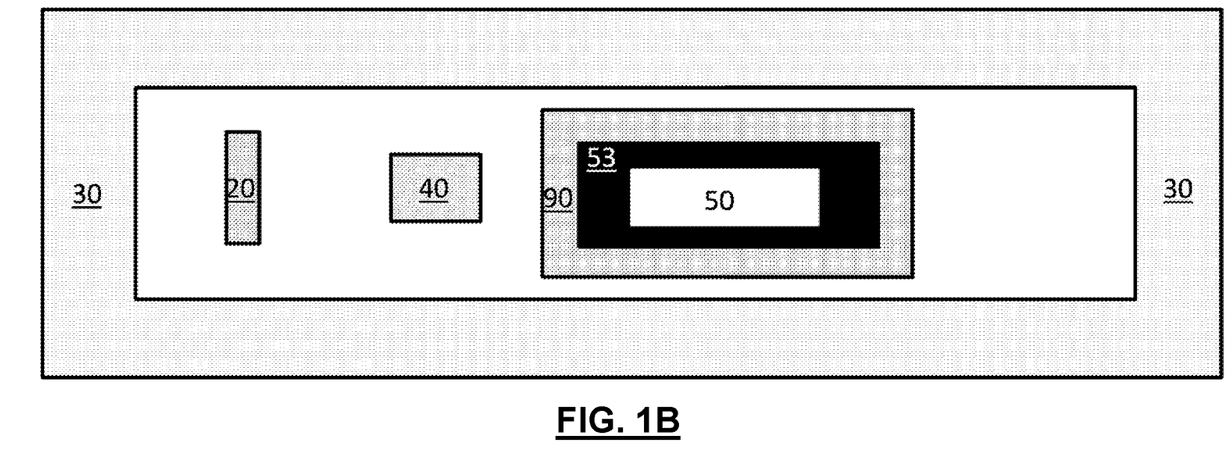

FIGS. 1A and 1B show cross-sectional and plan views of a through silicon interposer wafer in accordance with a first embodiment of the present invention.

With reference to FIGS. 1A and 1B, the through silicon interposer (TSI) wafer 10 includes at least one cavity 50 formed therein for MEMS applications on substrate 12, and one or more filled silicon via 90 formed sufficiently proximate to the at least one cavity 50 to provide boundary walls of the at least one cavity 50. Particularly, as shown in both FIGS. 1A and 1B, the one or more filled silicon via 90 can frame the at least one cavity 50 by defining the walls of the cavity 50 on all vertical sides. The one or more filled silicon via 90 can be through silicon vias 90 as shown in FIGS. 3C and 3D. In other words, the filled silicon vias 90 can form the walls of the at least one cavity 50, and can be processed (e.g. through grinding and/or polishing) to completely pass through the interposer wafer 10 (as shown in FIGS. 3C and 3D). It can also be appreciated that the one or more filled silicon via 90 may only extend partially into the interposer wafer 10. For example, with reference to FIGS. 2A and 4, the one or more filled silicon via 90 in an alternate embodiment need not pass through the interposer wafer 10 upon processing. Accordingly, the one or more filled silicon vias 90, that are sufficiently proximate to the at least one cavity 50, does not need to have electrical connections. The one or more filled silicon vias 90 can be electrically isolated. The at least one cavity 50 can also include getter materials 51, 52 deposited and lifted-off using a photomask M4 (more details provided in FIG. 6) used to define the at least one cavity 50. Thus, the interposer wafer 10 can further comprise getter materials 51, 52 formed over an open surface of the at least one cavity 50. The use of the same photomask M4 in patterning of the at least one cavity 50 and patterning of getter materials can advantageously reduce number of photomasks required, and hence simplify fabrication processes and reduce costs.

The interposer wafer 10 can also include one or more filled silicon via 20, sealing ring standoff 30, bonding pad standoff 40, and an electrode 80. As shown in FIGS. 1A and 1B, the sealing ring standoff 30 encloses the one or more filled silicon vias 20, 90, the bonding pad standoff 40, the electrode 80 and the at least one cavity 50.

The one or more filled silicon via 20 can be positioned away from the at least one cavity 50, and electrically connected to a bonding pad standoff 40 via redistribution lines. The one or more filled silicon via 20 can be processed to form a through silicon via 20 (as shown in FIGS. 3C and 3D), and electrically connect the packaged MEMS device to external connections on opposite side of the interposer wafer for testing and operations. In embodiments of the present invention, the one or more filled silicon via 20 can be formed simultaneously with the one or more filled silicon via 90. The one or more filled silicon vias 20, 90 can be filled with material for providing electrical feedthrough from one side of the interposer wafer 10. As shown in FIG. 1A, the material that fills the one or more filled silicon vias 20, 90 can comprise a first conductive material 22 and a second conductive material 24, the first and the second conductive material 22, 24 being separated by a first dielectric material 23. In embodiments of the invention, a third conductive material 31, 32 can electrically connect at least a portion of the first and the second conductive material 22, 24, and the third conductive material 31, 32 is deposited on at least a portion of the second conductive material 24. The third conductive material 31, 32 can also be deposited on the first conductive material 22. The first and second conductive material 22, 24 can comprise either polysilicon or copper. The third conductive material 31, 32 can comprise a material selected from a group comprising tantalum, tantalum alloys, tantalum nitrides, titanium, titanium alloys, titanium nitrides and germanium or a combination of these materials.

Each of the one or more filled silicon vias 20, 90, the sealing ring standoff 30, the bonding pad standoff 40, and the electrode 80 is electrically isolated from the interposer wafer 10 by a second dielectric material 21 disposed on a surface of the interposer wafer. As shown in FIG. 1A, the second dielectric material 21 is also deposited within the one or more filled silicon vias 20, 90. Specifically, the second dielectric material 21 is deposited between the material that fills the filled silicon vias 20, 90 and the interposer 10.

The sealing ring standoff 30 and bonding pad standoff 40 (referred to as at least one standoffs 30, 40 below) are similarly formed using the same processes as the one or more filled silicon vias 20, 90. Each of the at least one standoffs 30, 40 defines a local bonding area for one or more bond pads (e.g. bonding pad standoff 40) and/or one or more sealing rings (e.g. sealing ring standoff 30). The at least one standoffs 30, 40 comprises the first and second conductive materials 22, 24 separated by the first dielectric material 23. As shown in FIG. 1A, the first dielectric material 23 is disposed on at least a portion of the first conductive material 20, and the third conductive material 31, 32 is disposed on at least another portion of the first conductive material 22, the second conductive material 24 and the first dielectric material 23. The first dielectric material 23 can be used advantageously to control the height of the at least one standoffs 30, 40, while the third conductive material 31, 32 electrically connects the first and the second conductive materials 22, 24. The bonding pad standoff 40 can be electrically connected to the one or more filled silicon via 20 with at least one redistribution line. The at least one redistribution line comprises the first conductive material 22 and/or the third conductive material 31, 32.

The electrode 80 comprises a part of paired-electrode of the MEMS device which the interposer wafer 10 encapsulates. The electrode 80 comprises at least the first conductive material 22 and the third conductive material 31.

When deposited within the one or more silicon vias 20, 90, the first and the second conductive material 22, 24 can serve the same purpose of providing electrical feedthrough. However, when deposited on the surface of the interposer wafer 10, the second conductive material 24 can also perform an additional function as compared to the first conductive material 22. The first conductive material 22 can contribute to formation of the electrode 80 and the at least one redistribution line. The second conductive material 24 can additionally contribute to formation of the sealing ring standoff 30 and the bonding pad standoff 40.

Figure 2A:
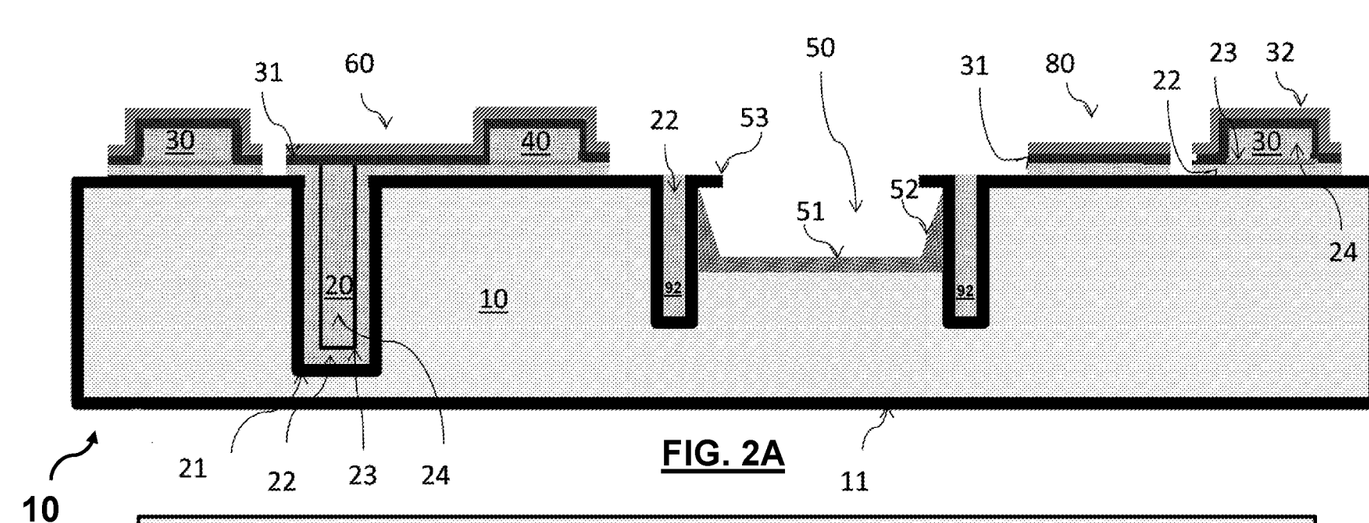
FIGS. 2A and 2B show cross-sectional and plan views of a through silicon interposer wafer in accordance with a second embodiment of the present invention.
Figure 2B:
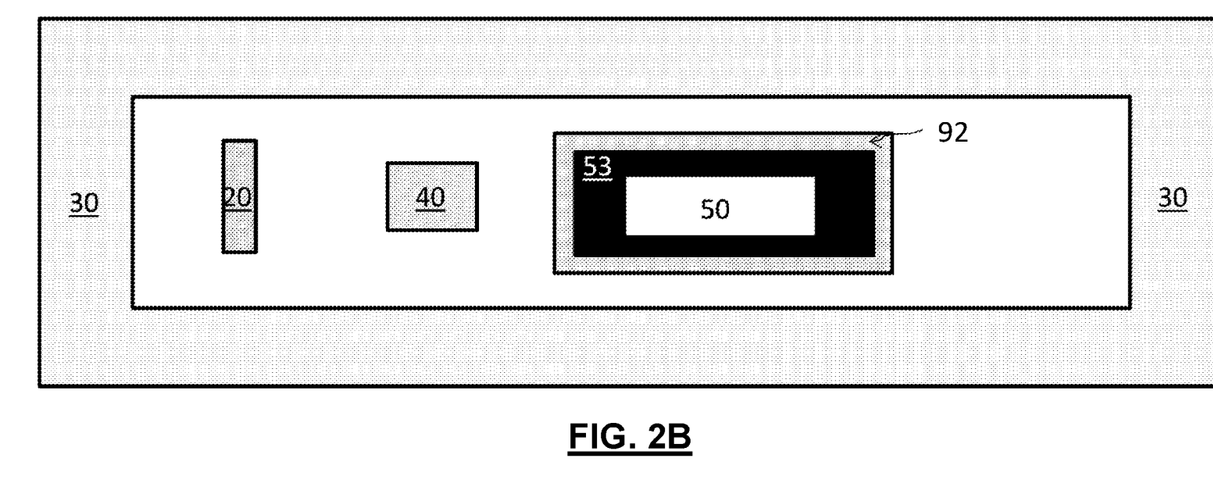

FIGS. 2A and 2B show cross-sectional and plan views of a through silicon interposer wafer in accordance with a second embodiment of the present invention. In the second embodiment, the one or more silicon via 92 enclosing the at least one cavity 50 has been scaled down. Due to the smaller opening of the one or more silicon via 92, the depth of the one or more silicon via 92 lags behind the larger opening of the one or more silicon via 20. In other words, the silicon deep reactive-ion etching (DRIE) depth of silicon via 92 lags behind the DRIE depth of silicon via 20. Hence, the one or more silicon via 20 extends deeper into the interposer wafer 10 as compared to the one or more silicon via 92. Additionally, due to the narrower opening, the silicon via 92 may be completely filled during the partial deposition of the first conductive material 22. The reduced size of the silicon via 92 can advantageously control the stress effect in deposition of the conductive material and in post bond grinding (which occurs after encapsulation of MEMS device). The reduced size can also reduce DRIE loading during the etching step.

Figure 3A:
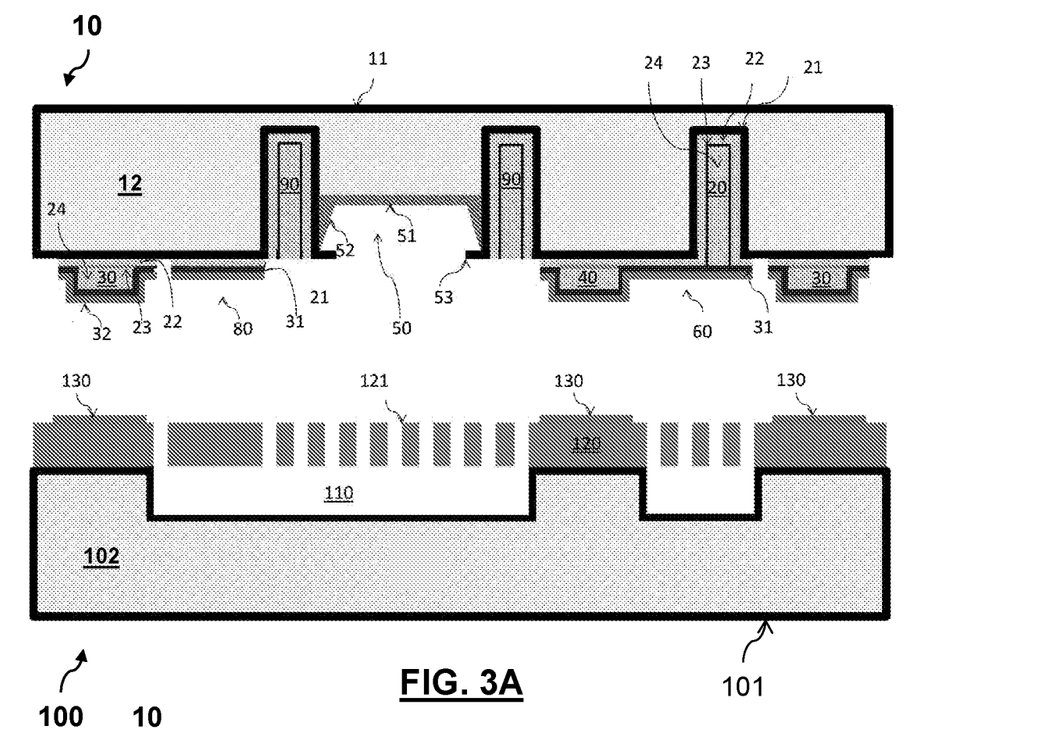
FIGS. 3A and 3B show cross-sectional views of a TSI wafer and a MEMS substrate prior to and after being bonded in accordance with the first embodiment of the present invention.
Figure 3B:
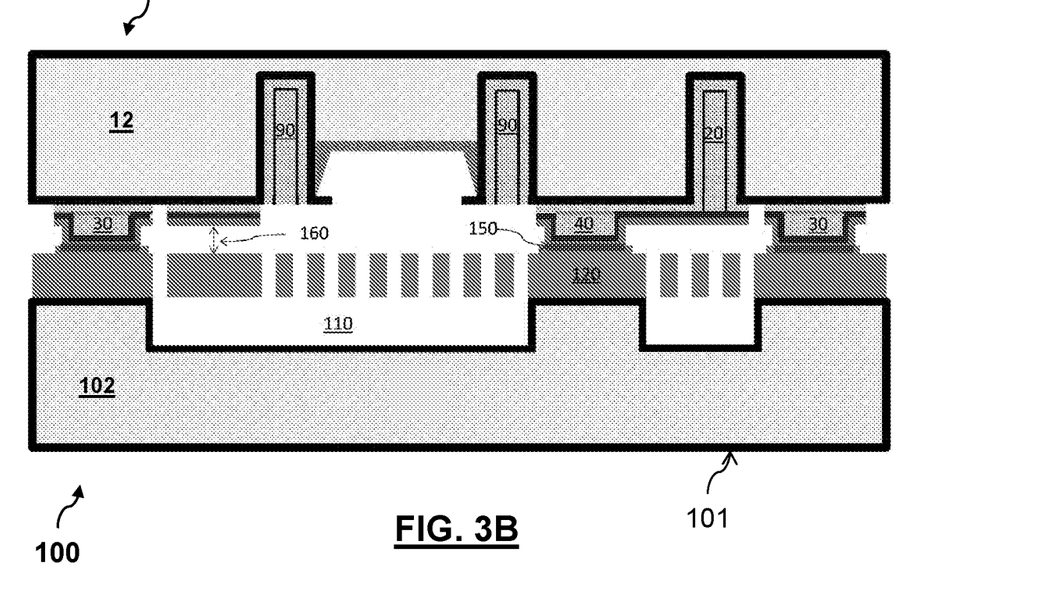
Figure 3C:
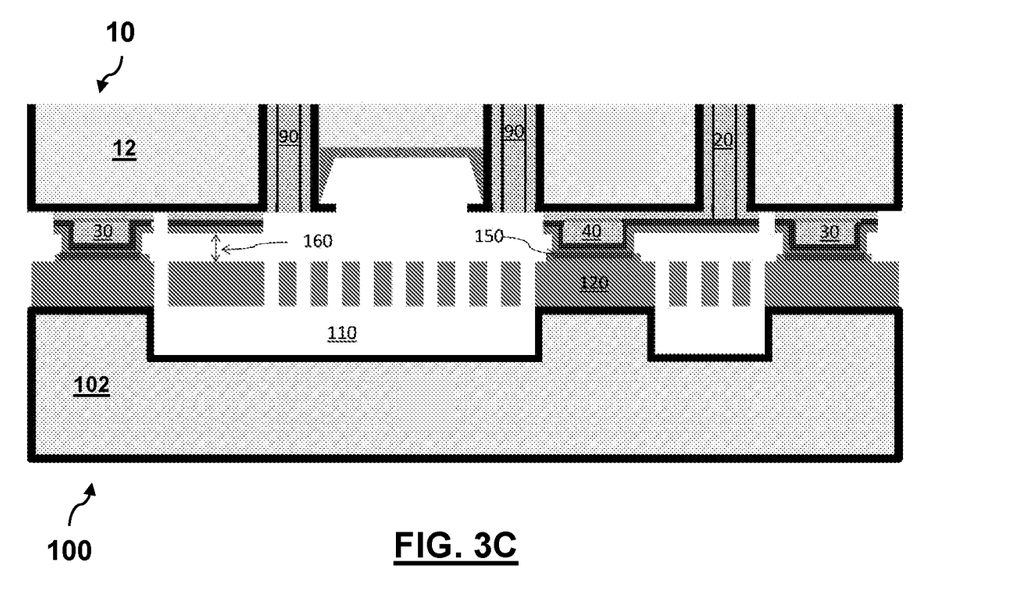
FIG. 3C shows a cross-sectional view of the bonded MEMS-TSI wafer grinded and/or polished in preparation for fabrication of redistribution line.
Figure 3D:
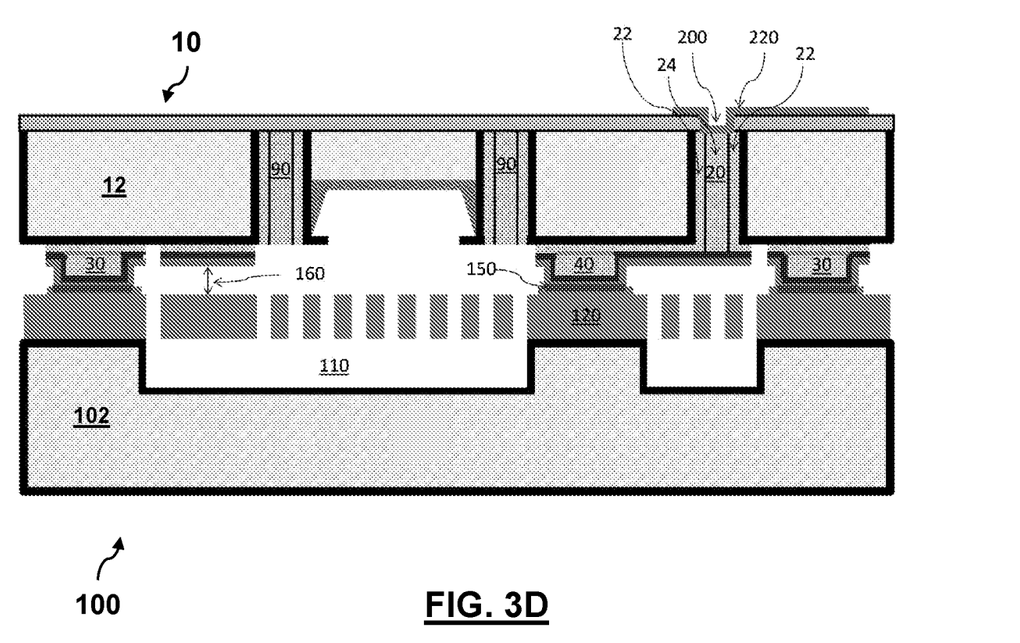
FIG. 3D shows the bonded MEMS-TSI wafer ready for testing.

FIGS. 3A and 3B show cross-sectional views of a TSI wafer 10 and a MEMS substrate 100 prior to and after being bonded in accordance with the first embodiment of the present invention.

The MEMS substrate 100 is only for the illustration purpose and does not limit the packaging scope of the invention. Herein, the MEMS substrate 100 is an SOI or cavity SOI wafer. Wafer cavity 110 is formed by conventional Si DRIE (silicon deep reactive-ion etching), followed by wet clean and thermal oxide growth 101. In another embodiment, the oxide 101 can be deposited or grown before cavity etch step. Wafer substrate 100 is fusion bonded with a highly doped single crystal silicon substrate 120, which is later grinded and polished to the desired device layer thickness. Metallic film 130 is deposited and patterned to form the electrical bond pads and seal ring. MEMS device 121 is patterned into the silicon device layer. For ease of bonding and achieving hermeticity, the metal 130 may be a eutectic pair of the third conductive material 32. For example, if the third conductive material 32 comprises germanium, the metal 130 can be a eutectic pair of bonding germanium layer 32 on the TSI wafer.

FIG. 3A illustrates cross-sectional views of the TSI wafer 10 and the MEMS substrate 100 prior to bonding. The TSI wafer 10 is orientated to bond with MEMS substrate 100. The bonding pad standoff 40 and sealing ring standoffs 30 are aligned to respective patterns which have eutectic pair material (e.g. germanium on TSI wafer 10 and aluminium on the MEMS substrate 100) ready for bonding. In another embodiment, these eutectic pair material can be interchanged. In other words, aluminium can be used as the third conductive material 31 at TSI wafer 10 while germanium is used at MEMS substrate 100. Alternate eutectic pairs such as Cu—Sn or Au—Si may also be used.

FIG. 3B show cross-sectional views of the TSI wafer 10 and the MEMS substrate 100 after bonding. Eutectic intermix bonding layer 150 is formed for hermetic sealing and electrical connections. The vertical MEMS device 121 top and bottom electrode gap 160 is controlled by the standoff structures, i.e. seal ring 30 and bonding pad 40.

FIG. 3C shows a cross-sectional view of the bonded MEMS-TSI wafer grinded and/or polished in preparation for fabrication of redistribution line. The TSI wafer 10 is grinded and/or polished to reveal the filled silicon vias 20, 90 from the opposite side of the TSI wafer 10. In other words, the thickness of the final grinded TSI wafer thickness is smaller than the initial depth of the one or more filled silicon vias 20, 90. The silicon substrate 12 of TSI wafer 10 is also exposed in the grinding and/or polishing process.

FIG. 3D shows the bonded MEMS-TSI wafer ready for testing. The grinded TSI wafer 10 is passivated with PECVD oxide having thickness about 1 to 3 μm, followed by oxide via opening 200 and top redistribution line 220 formation. The redistribution line 220 forms an electrical connection to the encapsulated MEMS device 120 through the through silicon via 20, bond pad 40 and eutectic intermix bonding layer 150. In embodiments, the redistribution line 220 comprises aluminum. Its thickness of the redistribution line can be between, but not limited to 0.5 μm to 2 μm. The via 200 is opened such that redistribution line metal is able to electrically connect the first and the second conductive material 22, 24 so that effective resistance of the through silicon via is low.

Figure 4:
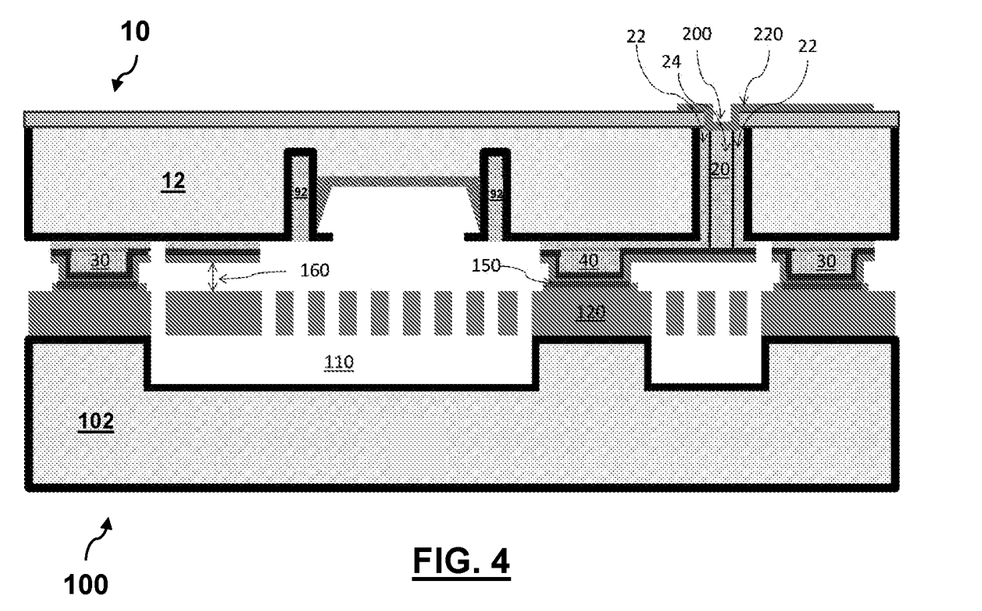
FIG. 4 shows a bonded MEMS-TSI wafer in accordance with the second embodiment of the present invention, the bonded MEMS-TSI wafer ready for testing.

FIG. 4 shows a bonded MEMS-TSI wafer in accordance with the second embodiment of the present invention, the bonded MEMS-TSI wafer being ready for testing. The TSI wafer 10 of FIG. 4 corresponds to the TSI wafer 10 of FIGS. 2A and 2B, where the size of the one or more filled silicon vias 92 sufficiently proximate to the at least one cavity 50 is scaled down. The one or more filled silicon vias 92 is not reveal after the TSI wafer 10 is grinded and/or polished to reveal the one or more filled silicon vias 20. In other words, the one or more filled silicon vias 92 sufficiently proximate to the at least one cavity 50 does not extend through the interposer wafer 10. Similar to the configuration shown in FIG. 3D, via 200 of FIG. 4 is opened such that redistribution line 220 electrically connects the first and the second conductive material 22, 24 and advantageously lowers the resistance of the one or more filled silicon vias 20. In embodiments, the redistribution line 220 comprises aluminum. Its thickness of the redistribution line can be between, but not limited to 0.5 μm to 2 μm.

Figure 5:
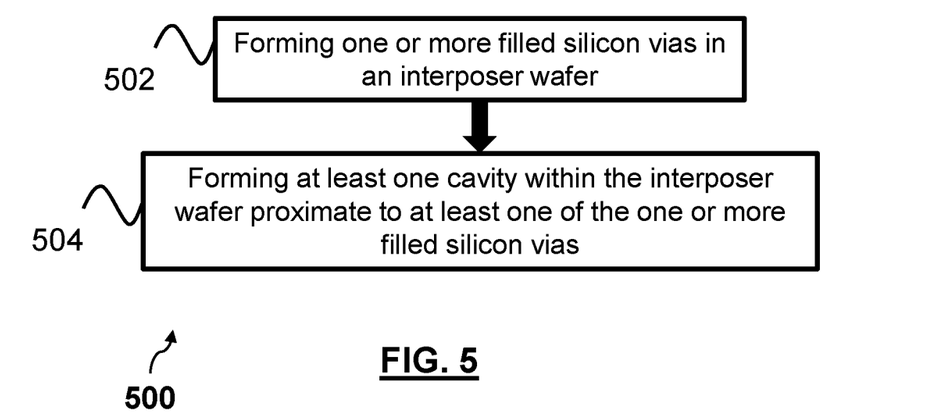
FIG. 5 shows a flowchart illustrating a method of manufacturing a through silicon interposer wafer in accordance with embodiments of the present invention.
Figure 6:
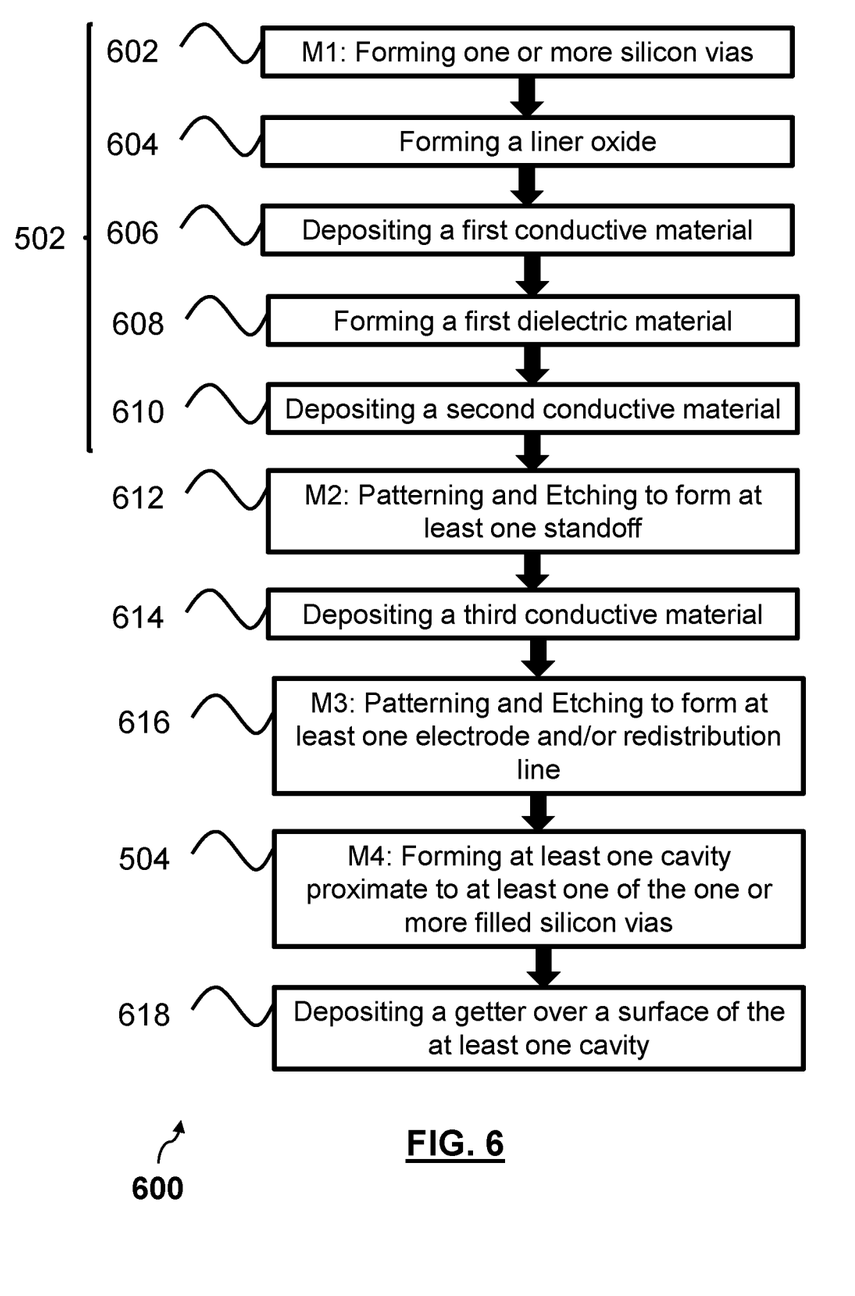
FIG. 6 shows a flowchart illustrating another method of manufacturing a through silicon interposer wafer in accordance with embodiments of the present invention.

The formation and structure of the interposer wafer 10 shown in FIGS. 1A and 1B is now described in greater detail, with reference to the method of manufacturing as shown in FIGS. 5 and 6. FIGS. 5 and 6 each shows a flowchart illustrating a method 500, 600 of manufacturing a through silicon interposer wafer in accordance with embodiments of the present invention.

With reference to FIG. 5, the method 500 of manufacturing a through interposer wafer having at least one cavity formed therein for MEMS applications broadly includes, at step 502, forming one or more filled silicon vias in the interposer wafer, and at step 504, forming the at least one cavity within the interposer wafer sufficiently proximate to at least one of the one or more filled silicon vias. The at least one of the one or more silicon vias provide support for walls of the at least one cavity during formation and subsequent processing of the interposer wafer. It can be appreciated that intermediate steps may be present between the steps 502 and 504, and that each of the steps 502 and 504 can comprise different process stages. For example, the step 502 of forming one or more filled silicon vias in the interposer wafer can comprise at least the step of forming one or more silicon vias in the interposer wafer and the step of filling the one or more silicon vias with material to provide the support for the walls of the at least one cavity during the formation and subsequent processing of the interposer wafer.

FIG. 6 illustrates such a method. FIG. 6 illustrates an exemplary method 600 of manufacturing a through interposer wafer in accordance with embodiments of the present invention. The method 600 can be used to manufacture the through silicon interposer wafer 10. In the method 600, the step 502 comprises intermediate steps 602 to 610. The steps 602 to 610 show an exemplary method of forming the one or more filled silicon vias 20, 90. The steps 602 to 610 generally includes (i) forming the one or more silicon vias, (ii) depositing the first conductive material on the interposer and within the one or more silicon vias, (iii) forming a first dielectric material on the first conductive material, and (iv) depositing a second conductive material on the first dielectric material. Detailed elaboration of the steps 602 to 610 are provided below. Steps 612 to 616 are also present between the steps 502 and 504. The intermediate steps 612 to 616 show an exemplary method of forming the sealing ring standoff 30, the bonding pad standoff 40, and the electrode 80, while further processing the one or more filled silicon vias 20, 90.

The method 600 first include step 602, forming one or more silicon vias 20, 90 in the interposer wafer using photomask M1. Specifically, the step 602 comprises patterning and etching the substrate 12 using the photomask M1 to form the one or more silicon vias 20, 90. Once the one or more silicon vias 20, 90 are formed, the substrate 12 is then subjected to steps 604 to 610. The steps 604 to 610 comprise the steps of filling the one or more silicon vias 20, 90 with material (i.e. the first and second conductive material 22, 24, and the first dielectric material 23) to provide the support for the walls of the at least one cavity 50 during the formation and subsequent processing of the interposer wafer 10.

The substrate 12 is then subjected to step 604 of forming a liner oxide. The liner oxide (also referred to as second dielectric material 11, 21) that is formed comprises a dielectric layer 11 at the surface of the interposer wafer 10, and liner oxide 21 within the one or more silicon vias 20, 90. Specifically, with reference to FIG. 1A, the step 604 comprises forming the second dielectric material 11, 21 on (i) a surface of the interposer wafer 10, (ii) the at least one cavity 50 having an opening in the surface of the interposer wafer 10, and (iii) within the one or more silicon vias 20, 90. The liner oxide 11, 21 can be formed by subjecting the substrate 12 to either thermal oxidation or low pressure chemical vapor deposition (LPCVD) of tetraethyl orthosilicate (TEOS). The thickness of the liner oxide can be, but is not limited to between 1 to 2 μm.

The step 604 is followed by step 606 which includes depositing the first conductive material 22 on the interposer wafer 10 and within the one or more silicon vias 20, 90. The step 606 includes partially filling the one or more silicon vias 20, 90 with the first conductive material 22. In an embodiment, the step 606 can include depositing heavily doped polysilicon as the first conductive material.

The first dielectric material 23 is then formed in step 608, which includes forming the first dielectric material 23 on at least a portion of the first conductive material 22. With reference to FIG. 1A, the first dielectric material 23 is formed on the first conductive material 22 that is within the one or more silicon vias 20, 90, and on at least a portion of the first conductive material 22 that is on the surface of the interposer wafer 10. In embodiments, the first dielectric material 23 that are formed on the surface of the interposer wafer 10 can advantageously control the gap between paired electrodes of the MEMS device that is encapsulated by the interposer wafer 10. The first dielectric material 23 can be formed by thermally oxidizing at least a portion of the partially deposited polysilicon to form a thin layer of thermal oxide. The thickness of the oxide, being the first dielectric material, can be, but not limited to between 1 to 100 nm. The first dielectric material 23 can also be deposited using any conformal deposition process such as LPCVD. In alternate embodiments, the first dielectric material 23 can be formed only within the one or more silicon vias 20, 90.

The one or more silicon vias 20, 90 is then completely filled in step 610, which deposits the second conductive material 24 on the first dielectric material 23. In an embodiment, the one or more silicon vias can be completely filled with heavily doped polysilicon. Thus, it can be appreciated that the one or more silicon vias 20, 90 formed using the method 600 can provide electrical connection. Specifically, it can be appreciated that the step of forming the one or more filled silicon vias 20, 90 in the interposer wafer 10 comprises forming one or more through silicon vias 20, 90 in the interposer wafer 10 (as shown in FIG. 3D), and the step of filling the one or more silicon vias 20, 90 comprises filling the one or more silicon vias 20, 90 with material which will provide electrical feedthrough from one side to another of the interposer wafer 10. In other words, where the one or more filled silicon vias 20, 90 can extend through the interposer wafer 10, and that the material within the one or more filled silicon vias 20, 90 can bridge electrical connections from one side of the interposer to the other. The first dielectric material 23 formed within the one or more silicon vias 20, 90 can advantageously increase effective skin depth at high frequencies due to multi-layer conduction. In embodiments where the first and the second conductive material 22, 24 is copper, the multi-layer conduction is more significant and the MEMS device can be advantageously operated at very high frequencies (e.g. at radio frequency range). Accordingly, the first and second conductive material 22, 24 can comprise either polysilicon or copper.

At step 612, the method 600 comprises patterning and etching to form at least one standoff using photomask M2. With reference to FIG. 1, the step 612 includes patterning the second conductive material 24 to form the sealing ring standoff 30 and the bonding pad standoff 40, and the etch stops at the height of the first dielectric material 23. In an alternate embodiment, the height of the standoffs 30, 40 can be further adjusted by etching back and/or partial polishing the second conductive layer 24 before defining the standoffs 30, 40. Further, the second conductive layer 24 can be split into multiple layers with oxide growth and/or deposition in between the layers to achieve better process control on patterning (e.g. etch-back and/or polishing). In other words, the step 612 of patterning the second conductive material 24 to form the at least one standoff 30, 40 can comprise adjusting a height and/or a surface roughness of the second conductive material. In yet another embodiment, where the first dielectric material 23 is retained only within the one or more silicon vias 20, 90, the second conductive material 24 can be time-etched (partial silicon etch) to define the at least one standoff.

At step 614, the method 600 comprises depositing a third conductive material 31. The step 614 can include depositing a third conductive material 31, 32 on at least a portion of the second conductive material 24, wherein the third conductive material 31, 32 electrically connects at least a portion of the first and the second conductive material 22, 24. In other words, with reference to FIG. 1A, the step 614 includes depositing the third conductive material 31, 32 on the second conductive material 24 of the sealing ring standoff 30 and the bonding pad standoff 40. The step 614 also includes depositing the third conductive material 31, 32 on at least a portion of the first conductive material 22 exposed by the etch-back in step 612.

Accordingly, in embodiments, the method 600 can further include, in step 612, patterning the second conductive material 24 and then depositing the third conductive material 31, 32 to form at least one standoff 30, 40. Thus, the first dielectric material 23 can be formed on at least a portion of the first conductive material 22 present on the surface of the interposer wafer 10, and the standoffs 30, 40 includes the first and second conductive layers 30, 40 separated by the first dielectric layer 23, and electrically connected through the third conductive layer 31. The third conductive material 31, 32 can be a non-eutectic film stack of tantalum and/or titanium and/or their nitrides with thickness of between 0.1 to 0.5 µm and a further deposition of a film stack of germanium with thickness of between 0.2 to 0.6 µm. In an alternate embodiment, the third conductive material can include only the film stack of germanium with thickness of between 0.2 to 0.6 µm, if the germanium is heavily doped, or if the step of depositing the first dielectric material 23 on the surface of the interposer wafer 10 is omitted. Accordingly, the third conductive material 31, 32 can comprises a material selected from a group comprising tantalum, tantalum alloys, tantalum nitrides, titanium, titanium alloys, titanium nitrides and germanium or a combination of these materials.

At step 616, the method comprises patterning and etching to form at least one electrode and/or redistribution line using a photomask M3. Specifically, with reference to FIG. 1, the step 616 comprises using the photomask M3 to simultaneously pattern the first conductive material 22 and the third conductive material 31, 32 to form at least one electrode 80 and/or the redistribution line. The electrode 80 and/or the redistribution line patterned thus comprises the first conductive material 22 and the third conductive material 31, 32. It can be appreciated that height and/or surface roughness adjustments performed on the second conductive material 24 can also be performed at locations where the at least one standoff 30, 40 are.

In embodiments of the invention where the first dielectric material 23 is omitted from the surface of the interposer wafer 10, the second conductive material 24 may be deposited on the first conductive material 22. Thus, the step 612 of patterning and etching to form the at least one standoff 30, 40 may further include, patterning the second conductive material 24 to the height of the first conductive layer 22, to form at least one additional element at locations where the electrode and/or the redistribution line will be. The third conductive material 31, 32 is then deposited on the at least one additional element, and the at least one additional element is patterned and etch at the step 616 to form the at least one electrode and/or redistribution line with a photomask M3. In other words, the step 612 of patterning the second conductive material 24 to form the at least one standoff 30, 40 comprises patterning the second conductive material 24 to form the at least standoff 30, 40 and at least one additional element. The steps 614 and 616 that follow comprises depositing the third conductive material 31 to form the at least one electrode 80 and patterning the third conductive material 31 and the first conductive material 22 at the at least one additional element. The electrode 80 thus comprises the first conductive material 22 and the third conductive material 31. The step 616 also comprises patterning the third conductive material 31 and the first conductive material 22 to form the at least one redistribution line. The at least one redistribution line comprises the first conductive material 22 and/or the third conductive material 31.

At step 504 which follows step 616, the step 504 comprises forming the at least one cavity 50 sufficiently proximate to at least one of the one or more filled silicon vias 90 using photomask M4. The at least one cavity 50 can be formed by isotropic etching, the boundary for which is predefined by the filled silicon vias 90, which is formed simultaneously with the filled silicon via 20. In embodiments, the filled silicon vias 90 can be considered dummy TSVs as they are electrically isolated (see FIG. 3D) while the filled silicon via 20 is considered functional. In other words, the dummy TSV 90 does not have electrical connections and can make a complete loop as shown in FIG. 1B.

At step 618, getter materials 51, 52 are deposited over a surface of the at least one cavity 50 and lifted-off using the photomask M4 used to define the cavity 50. As sidewall of the cavity does not contain resist during getter deposition, a 3D getter is obtained with getter 52 on the cavity side wall. As the cavity pattern area 50 is smaller than the dummy TSV 90, shadow mask 53 can be obtained. Since the same photomask M4 is used in both etching of the cavity 50 and the lift-off of getter materials 51, 52, an additional masking step can be advantageously eliminated.

Accordingly, it can be seen that the through silicon interposer and method of manufacturing the same in accordance with the present embodiments have the advantages of reduced masking layers, lower fabrication cost and high manufacturability. Particularly, the fabrication cost can be lowered through reduced number of deposition and masking levels. The presence of one or more filled silicon vias sufficiently proximate to the at least one cavity on the interposer wafer are also used to define the at least one cavity, thus allowing lift-off of getter films using the same mask as cavity etch. In addition, embodiments of the present invention can use materials such as polysilicon and thermally grown oxide which compared to PECVD dielectrics, have lower outgas characteristics, and hence advantageously provide higher vacuum inside the device cavities and higher device performance. While exemplary embodiments have been presented in the foregoing detailed description of the invention, it should be appreciated that a vast number of variations exist.

It should further be appreciated that the exemplary embodiments are only examples, and are not intended to limit the scope, applicability, operation, or configuration of the invention in any way. Rather, the foregoing detailed description will provide those skilled in the art with a convenient road map for implementing an exemplary embodiment of the invention, it being understood that various changes may be made in the function and arrangement of elements and method of operation described in an exemplary embodiment without departing from the scope of the invention as set forth in the appended claims.

What is claimed is:

1. A through silicon interposer wafer having at least one cavity formed therein for MEMS applications, the interposer wafer comprising one or more filled silicon vias proximate to the at least one cavity, the one or more silicon vias framing the at least one cavity by defining walls of the cavity on all vertical sides and providing support for the walls of the at least one cavity during subsequent processing of the interposer wafer, wherein the one or more filled silicon vias are filled with a material, the material comprising a first conductive material and a second conductive material, the first and second conductive materials separated by a first dielectric material.

2. The interposer wafer as claimed in claim 1, wherein the one or more filled silicon vias comprises one or more filled through silicon vias.

3. The interposer wafer as claimed in claim 2, wherein the one or more filled through silicon vias are filled with material for providing electrical feedthrough from one side to other of the interposer wafer.

4. The interposer wafer as claimed in claim 1, wherein at least a portion of the first and the second conductive materials is electrically connected through a third conductive material, the third conductive material disposed on at least a portion of the second conductive material.

5. The interposer wafer as claimed in claim 4, further comprising at least one standoff, wherein the at least one standoff comprises the first and second conductive materials separated by the first dielectric material and electrically connected through the third conductive material.

6. The interposer wafer as claimed in claim 5, wherein each of the at least one standoff defines a local bonding area for one or more bond pads and/or one or more sealing rings.

7. The interposer wafer as claimed in claim 4, further comprising at least one electrode, wherein the at least one electrode comprises the first conductive material and the third conductive material.

8. The interposer wafer as claimed in claim 4, further comprising at least one redistribution line, wherein the at least one redistribution line comprises the first conductive material and/or the third conductive material.

9. The interposer wafer as claimed in claim 4, wherein the third conductive material comprises a material selected from a group comprising tantalum, tantalum alloys, tantalum nitrides, titanium, titanium alloys, titanium nitrides and germanium or a combination of these materials.

10. The interposer wafer as claimed in claim 1, comprising a second dielectric material disposed on a surface of the interposer wafer, the second dielectric further disposed within the one or more filled silicon vias and between the material that fills the filled silicon vias and the interposer wafer.

11. The interposer wafer as claimed in claim 1, wherein the first and the second conductive material comprise either polysilicon or copper.

12. The interposer wafer as claimed in claim 1, further comprising a getter material formed over an open surface of the at least one cavity.

13. A method of manufacturing a through silicon interposer wafer having at least one cavity formed therein for MEMS applications, the method comprising:
    forming one or more silicon vias in the interposer wafer;
    thereafter forming the at least one cavity within the interposer wafer proximate to at least one of the one or more silicon vias, and
    filling the one ore more silicon vias with a material to provide support for walls of the at least one cavity during formation and subsequent processing of the interposer wafer, wherein the at least one of the one or more silicon vias frame the at least one cavity by defining walls of the cavity on all vertical sides and provide support for the walls of the at least one cavity during formation and subsequent processing of the interposer wafer, and
    wherein filling the one ore more silicon vias with the material comprises
    depositing a first conductive material on the interposer wafer and within the one or more silicon vias;
    forming a first dielectric material on the first conductive material; and
    depositing a second conductive material on the first dielectric material.

14. The method as claimed in claim 13, wherein forming one or more filled silicon vias in the interposer wafer comprises forming one or more through silicon vias in the interposer wafer.

15. The method as claimed in claim 14, wherein filling the one or more silicon vias comprises filling the one or more through silicon vias with material which will provide electrical feedthrough from one side to other of the interposer wafer.

16. The method as claimed in claim 13, further comprising depositing a third conductive material on at least a portion of the second conductive material, wherein the third conductive material electrically connects at least a portion of the first and the second conductive material.

17. The method as claimed in claim 16, further comprising patterning the second conductive material and then depositing the third conductive material to form at least one standoff, the standoff comprising the first and second conductive materials separated by the first dielectric layer, and electrically connected through the third conductive material.

18. The method as claimed in claim 17, wherein patterning the second conductive material to form the at least one standoff comprises patterning the second conductive material to form the at least one standoff and at least one additional element, the method further comprising patterning the third conductive material and the first conductive material at the at least one additional element after depositing the third conductive material to form at least one electrode, the electrode comprising the first conductive material and the third conductive material.

19. The method as claimed in claim 18, wherein patterning the third conductive material and the first conductive material to form the at least one electrode comprises patterning the third conductive material and the first conductive material to form the at least one electrode and at least one redistribution line, the at least one redistribution line comprising the first conductive material and/or the third conductive material.

20. The method as claimed in claim 18, wherein patterning the second conductive material to form the at least one standoff and the at least one additional element further comprises adjusting a height and/or a surface roughness of the second conductive material.

21. The method as claimed in claim 16, further comprising simultaneously patterning the first conductive material and the third conductive material to form at least one electrode, the electrode comprising the first conductive material and the third conductive material.

22. The method as claimed in claim 16, wherein the third conductive material comprises a material selected from a group comprising tantalum, tantalum alloys, tantalum nitrides, titanium, titanium alloys, titanium nitrides and germanium or a combination of these materials.

23. The method as claimed in claim 13, wherein filling the one or more silicon vias with the material comprises forming a second dielectric material on a surface of the interposer wafer, the at least one cavity having an opening in the surface of the interposer wafer, the second dielectric further formed within the one or more silicon vias and between the first conductive material and the interposer wafer.

24. The method as claimed in claim 13, wherein the first and the second conductive material comprise either polysilicon or copper.

25. The method as claimed in claim 13, further comprising forming an open surface of the at least one cavity comprises depositing a getter over a surface of the at least one cavity.

* * * * *